US012439631B2

United States Patent
Park et al.

(10) Patent No.: US 12,439,631 B2
(45) Date of Patent: Oct. 7, 2025

(54) NON-SELF-ALIGNED WRAP-AROUND CONTACT IN A TIGHT GATE PITCHED TRANSISTOR

(71) Applicant: International Business Machines Corporation, Armonk, NY (US)

(72) Inventors: Chanro Park, Clifton Park, NY (US); Ruilong Xie, Niskayuna, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 807 days.

(21) Appl. No.: 17/531,966

(22) Filed: Nov. 22, 2021

(65) Prior Publication Data

US 2023/0163180 A1    May 25, 2023

(51) Int. Cl.
*H10D 30/62*        (2025.01)
*H10D 30/01*        (2025.01)
(Continued)

(52) U.S. Cl.
CPC ....... *H10D 30/6219* (2025.01); *H10D 30/024* (2025.01); *H10D 30/031* (2025.01);
(Continued)

(58) Field of Classification Search
CPC ............ H10D 30/6219; H10D 30/024; H10D 30/031; H10D 30/6211; H10D 30/6713; H10D 30/6729; H10D 30/6735; H10D 30/6757; H10D 62/118; H10D 62/151; H10D 64/01; H10D 30/43; H10D 30/014; H10D 62/121; H10D 84/0149;
(Continued)

(56) References Cited

U.S. PATENT DOCUMENTS 8,362,574 B2    1/2013 Kawasaki et al.
9,159,794 B2   10/2015 Yu et al.
(Continued)

FOREIGN PATENT DOCUMENTS

CN        109599366 A    4/2019

OTHER PUBLICATIONS

International Search Report and Written Opinion for International Application No. PCT/EP2022/080902; International Filing Date: Nov. 7, 2022; Date of mailing: Mar. 3, 2023; 14 pages.

*Primary Examiner* — Yara B Green
*Assistant Examiner* — Akhee Sarker-Nag
(74) *Attorney, Agent, or Firm* — Cantor Colburn LLP; Samuel Waldbaum

(57) ABSTRACT

An integrated circuit (IC) is provided. The IC includes a substrate that includes first and second channels. A shared source or drain (S/D) region is between the first and second channels. The shared source or drain region includes an uppermost surface and further includes a second surface recessed from the uppermost surface and sidewalls extending from the uppermost surface to the second surface to define a recess. First and second gate structures including gate metal are disposed on the first and second channels. An S/D wrap-around contact (WAC) includes a first portion which extends into the recess to contact the second surface and the sidewalls and is wrapped around the S/D region at an exterior of the recess.

20 Claims, 5 Drawing Sheets

(51) Int. Cl.
  *H10D 30/67* (2025.01)
  *H10D 62/10* (2025.01)
  *H10D 62/13* (2025.01)
  *H10D 64/01* (2025.01)

(52) U.S. Cl.
  CPC ..... *H10D 30/6211* (2025.01); *H10D 30/6713* (2025.01); *H10D 30/6729* (2025.01); *H10D 30/6735* (2025.01); *H10D 30/6757* (2025.01); *H10D 62/118* (2025.01); *H10D 62/151* (2025.01); *H10D 64/01* (2025.01)

(58) Field of Classification Search
  CPC .. H10D 84/038; H10D 84/0133; H10D 84/83; B82Y 10/00; H01L 21/76897
  See application file for complete search history.

(56) References Cited

U.S. PATENT DOCUMENTS

| | | | |
|---|---|---|---|
| 9,397,197 | B1 | 7/2016 | Guo et al. |
| 9,478,622 | B2 | 10/2016 | Yu et al. |
| 9,620,642 | B2 | 4/2017 | Toh et al. |
| 9,716,158 | B1 | 7/2017 | Cheng et al. |
| 9,754,840 | B2 | 9/2017 | Lin et al. |
| 9,847,390 | B1 | 12/2017 | Xie et al. |
| 9,935,172 | B2 | 4/2018 | Yang et al. |
| 9,941,367 | B2 | 4/2018 | Wang et al. |
| 10,269,649 | B2 | 4/2019 | Wang et al. |
| 10,504,782 | B2 | 12/2019 | Suen et al. |
| 10,665,692 | B2 | 5/2020 | Xie et al. |
| 10,944,009 | B2 | 3/2021 | Wang et al. |
| 2011/0147840 | A1 | 6/2011 | Cea et al. |
| 2015/0194433 | A1 | 7/2015 | Ponoth et al. |
| 2015/0303118 | A1* | 10/2015 | Wang ................ H10D 84/0151 257/401 |
| 2016/0126310 | A1 | 5/2016 | Rodder et al. |
| 2016/0148936 | A1 | 5/2016 | Xu et al. |
| 2017/0110578 | A1* | 4/2017 | Okuno ................... H10D 30/62 |
| 2018/0248011 | A1 | 8/2018 | Mehandru et al. |
| 2019/0214502 | A1 | 7/2019 | Xu et al. |
| 2019/0252494 | A1 | 8/2019 | Chao et al. |
| 2020/0035549 | A1 | 1/2020 | Wu |
| 2020/0035787 | A1* | 1/2020 | Wang ................ H01L 21/76876 |
| 2020/0287039 | A1* | 9/2020 | Bi ......................... H10D 62/292 |
| 2021/0249419 | A1 | 8/2021 | Chang et al. |

* cited by examiner

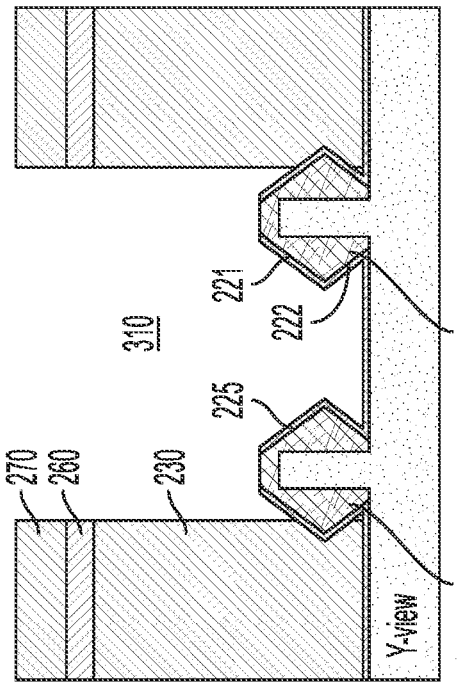
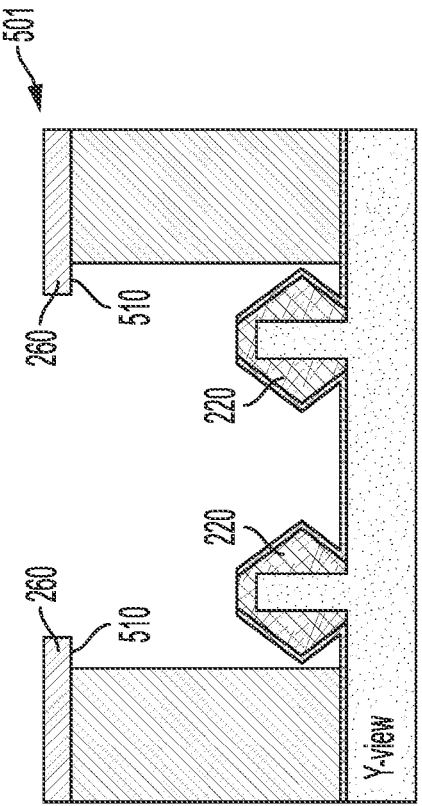
FIG. 3
FIG. 4
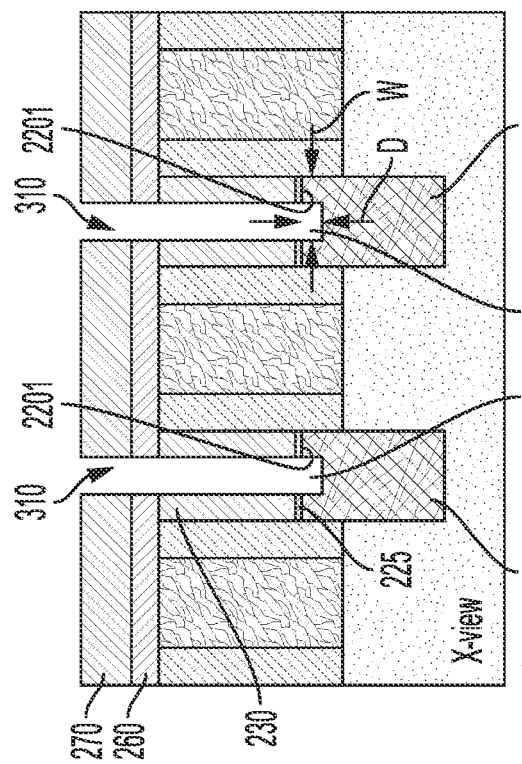
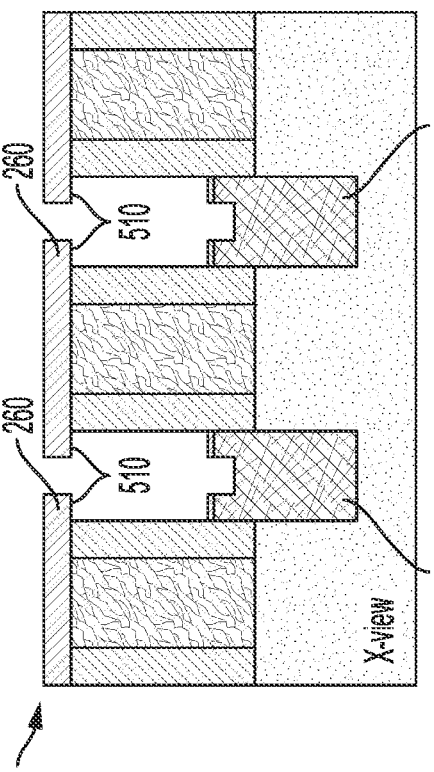
FIG. 5
FIG. 6

NON-SELF-ALIGNED WRAP-AROUND CONTACT IN A TIGHT GATE PITCHED TRANSISTOR

BACKGROUND

The present invention generally relates to semiconductor devices. More specifically, the present invention relates to structures and methods of fabricating a non-self-aligned wrap-around contact in a tight gate pitched transistor.

Non-planar transistor architectures (e.g., fin-type FETs (FinFETs) and nanosheet FETs) can provide increased device density and increased performance over planar transistors. FinFETs are non-planar, three-dimensional (3D) devices that include a fin-shaped element that defines the source, drain, and channel regions of the FinFET. A gate stack is formed over and around a central region of the fin-shaped element, and the portion of the fin that is under the gate stack functions as the FinFET channel. The portions of the fin that are not under the gate stack function as the source region and the drain region, respectively. Nanosheet transistors are non-planar FETs that increase channel conductivity and decrease FET size by forming the channel as a nanostructure. For example, a so-called gate-all-around (GAA) nanosheet FET provides a relatively small FET footprint by providing a source region, a drain region, and stacked spaced-apart nanosheet channels between the source and drain regions. A gate surrounds each stacked spaced-apart nanosheet channel and regulates electron flow through the nanosheet channels between the source and drain regions.

SUMMARY

Embodiments of the invention are directed to an IC. The IC includes a substrate that includes first and second channels. A shared source or drain (S/D) region is between the first and second channels. The shared source or drain region includes an uppermost surface and further includes a second surface recessed from the uppermost surface and sidewalls extending from the uppermost surface to the second surface to define a recess. First and second gate structures including gate metal are disposed on the first and second channels. An S/D wrap-around contact (WAC) includes a first portion which extends into the recess to contact the second surface and the sidewalls and is wrapped around the S/D region at an exterior of the recess.

Embodiments of the present invention are directed to a method of forming a portion of an integrated circuit (IC). The method includes forming a sacrificial layer. A pattern is formed, wherein the pattern is configured to define a part of a contact opening having an overlay error margin. A non-selective etch is applied through the pattern without an etch stop to open the contact opening through the sacrificial layer and a dielectric to form the contact opening and a recess in a source or drain (S/D) region. An isotropic etch is applied through the pattern to enlarge a width and a depth of the recess.

Embodiments of the present invention are directed to a method of forming a portion of an IC. The method includes forming a sacrificial layer. A pattern is formed and configured to define a part of a contact opening having an initial width. The pattern and a removal process are used to form the contact opening through the sacrificial layer, through the dielectric, and into a recess of a source or drain (S/D) region. An increased width of the contact opening, an increased width of the recess, and an increased depth of the recess are formed by removing an additional region of the dielectric and an additional region of the recess. The sacrificial layer is removed, and a capping layer is removed from the S/D region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3 is a schematic diagram illustrating a cross-sectional view of an intermediate structure of a semiconductor device taken from the X-view of FIG. 1 after fabrication operations have been performed in accordance with one or more embodiments of the present invention;

FIG. 4 is a schematic diagram illustrating a cross-sectional view of the intermediate structure of FIG. 3 taken from the Y-view of FIG. 1 after fabrication operations have been performed in accordance with one or more embodiments of the present invention;

FIG. 5 is a schematic diagram illustrating a cross-sectional view of a secondary intermediate structure of a semiconductor device taken from the X-view of FIG. 1 after fabrication operations have been performed in accordance with one or more embodiments of the present invention;

FIG. 6 is a schematic diagram illustrating a cross-sectional view of the secondary intermediate structure of FIG. 5 taken from the Y-view of FIG. 1 after fabrication operations have been performed in accordance with one or more embodiments of the present invention;

Figure 1:
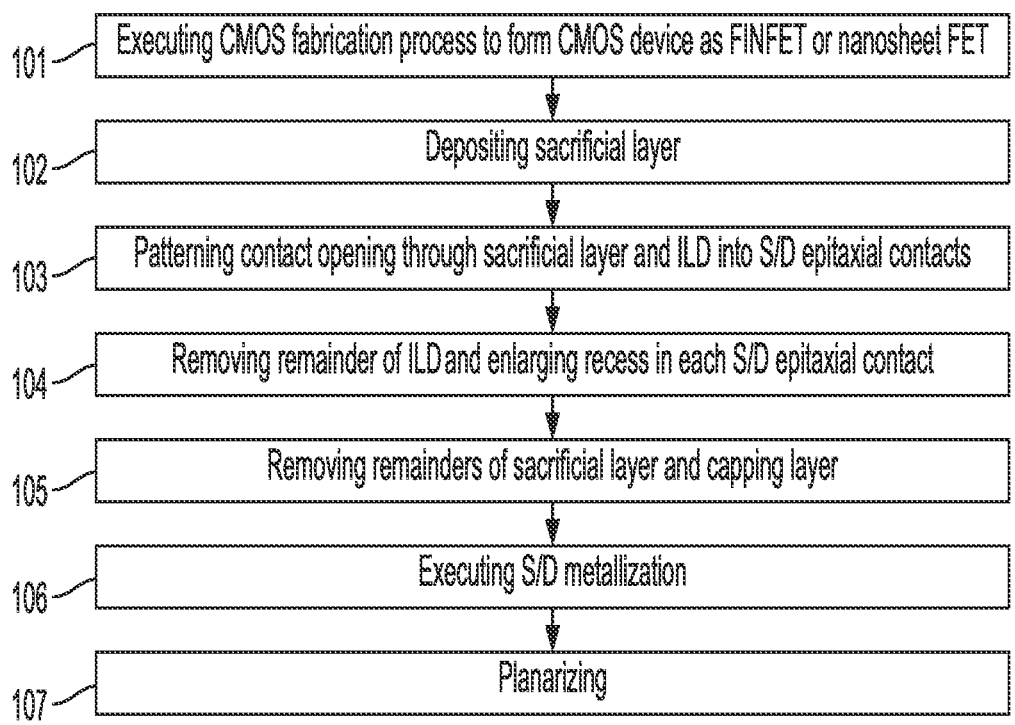
FIG. 1 is a flow diagram illustrating a semiconductor device fabrication method for execution with respect to a complementary-metal-oxide-semiconductor (CMOS) device in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to fabrication processes may or may not be described in detail herein. Moreover, the various tasks and process steps described herein can be incorporated into a more comprehensive procedure or process having additional steps or functionality not described in detail herein. In particular, various steps in the manufacture of semiconductor devices are well known and so, in the interest of brevity, many conventional steps will only be mentioned briefly herein or will be omitted entirely without providing the well-known process details.

Turning now to an overview of technologies that are more specifically relevant to aspects of the invention, reducing contact resistance has become increasingly important for continued complementary-metal-oxide-semiconductor (CMOS) scaling for FinFETs and for nanosheet FETs. While wrap-around contact (WAC) is a well-known approach to achieving reduced contact resistance and several schemes have been proposed to construct WACs in manners that are compatible with current CMOS flow, there remain several technical obstacles to building WACs.

For example, certain adaptive source/drain (S/D) contacts have been proposed but are not workable below 7 nm scaling due to tight gate pitch and lack of overlay error margin. Another option, aggressive tip-to-tip (t2t), has also been proposed and helps to enlarge S/D contact area but presents a risk of t2t shorting and does not allow for lower parts of epitaxy to be used for contacts due to negative epitaxy profiles. Early sillicidation and selective removal of sacrificial capping layer material are other options. In early sillicidation, a metallic material such as titanium is selectively deposited only on the S/D epitaxy and not on interlayer dielectric. No special patterning is needed. However, the silicide is exposed to high temperatures during later processing, which converts the silicide from a low resistance silicide to a high resistance silicide. In selective removal of sacrificial capping layer material, the S/D contact lands on S/D epitaxy and liner material is selectively removed to form channels through which metal is deposited and forms silicide but the channels are narrow and conformal deposition can be difficult along the narrow channels. Finally, there have been considerations toward moving to non-SAC middle-of-line processing because the processing can be completed easily, at low cost and with no need for complex modules like work function metal chamfering, metal gate recessing, SAC cap formation and SAC etching. At scales below 7 nm, however, these efforts are difficult because of overlay error margins.

Turning now to an overview of the aspects of the invention, one or more embodiments of the invention address the above-described shortcomings of the prior art by enabling non-SAC contact etch that is incorporated with a wrap-around contact. More specifically, embodiments of the invention provide for a non-SAC transistor with a tight gate pitched structure; a WAC to reduce S/D contact resistance; a bi-layer interlayer dielectric (ILD) that is disposed on top of gate metal before contact opening; and a smaller initial contact size and a controlled isotropic dielectric material etching to enable the non-SAC transistor and the WAC. A semiconductor device architecture is thus provided and includes an S/D WAC that wraps around doped S/D regions epitaxially grown on a fin or nanosheets with a gate structure which does not have an SAC cap and with a top surface of a metallized WAC S/D contact which is in plane with top surface of gate metal.

Turning now to a more detailed description of aspects of the present invention, FIG. 1 is a flow diagram illustrating a fabrication method for forming an IC having CMOS devices formed thereon in accordance with aspects of the invention. The method serves to open S/D contacts of the CMOS device and initially includes executing a CMOS fabrication process to form the CMOS device as one of a FinFET or a nanosheet FET (101) with gate metal; interlayer dielectric (ILD) (e.g., silicon dioxide); and doped S/D regions with a capping layer. The method includes depositing a sacrificial layer (e.g., silicon nitride) on the gate metal of the CMOS device (102), along with patterning a contact opening with a width of about 10 nm or less through the sacrificial layer and the ILD and into the S/D epitaxial regions to form a recess in each of the S/D epitaxial regions (103). The sacrificial layer can be deposited to have a thickness that permits relatively easy removal. In some cases, the thickness can be about 3 nm to about 15 nm or about 10 nm. The method also includes removing by isotropic etching a remainder of the ILD beneath overhanging portions of a remainder of the sacrificial layer and enlarging a width and a depth of the recess in each of the doped S/D regions (104) and removing a remainder of the sacrificial layer and a remainder of a capping layer on each of the doped S/D regions (105). The sacrificial layer prevents vertical erosion of the ILD during the isotropic etching of operation 105. In addition, the method can include executing S/D metallization by depositing conductive metal in the contact opening to form wrap-around contacts at each of the S/D epitaxial regions (106) and planarizing the S/D metallization with the gate metal (107).

Figure 2:
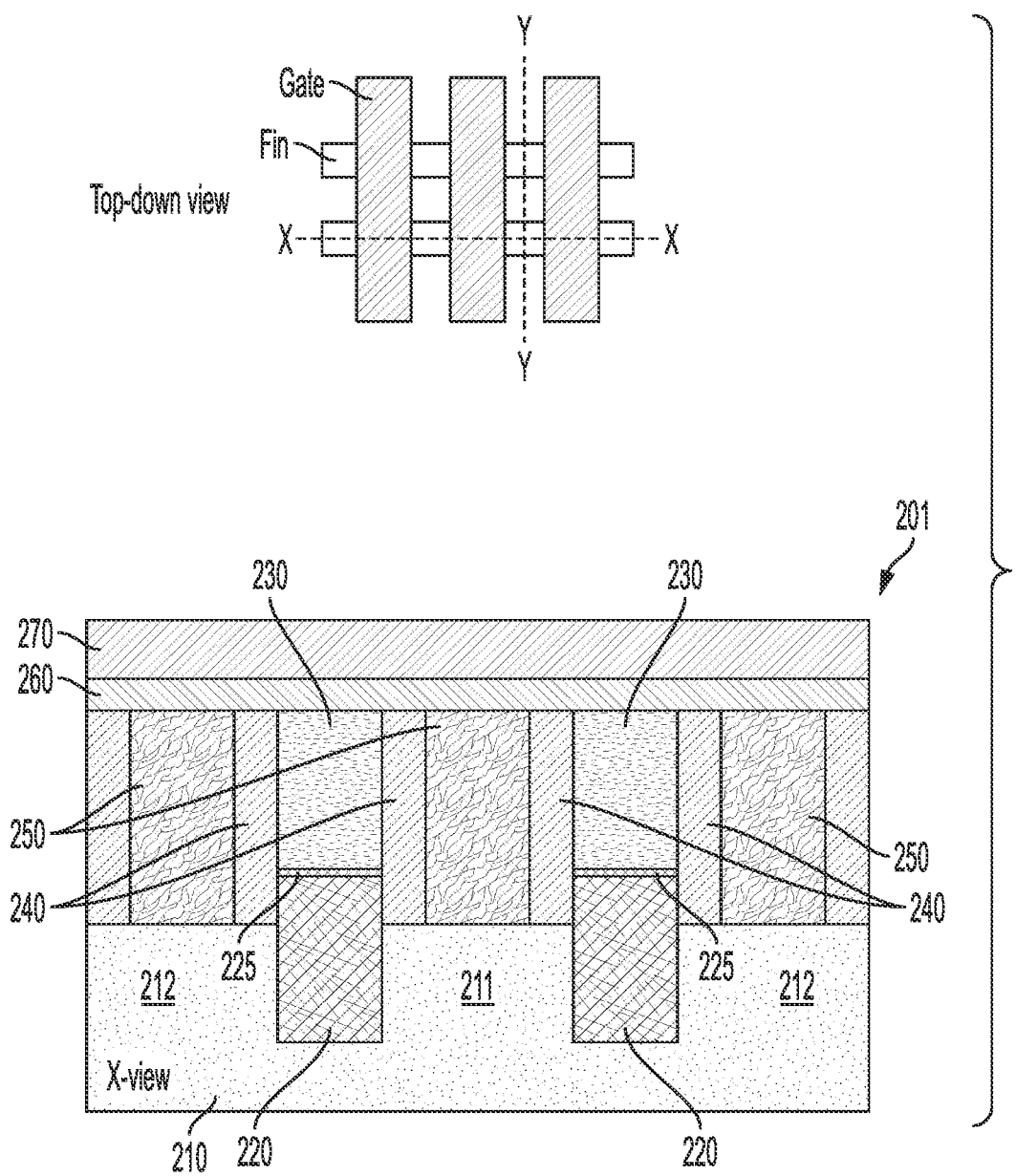
FIG. 2 is a schematic diagram illustrating a cross-sectional view of an initial structure of a semiconductor device taken from the X-view of FIG. 1 after fabrication operations have been performed in accordance with one or more embodiments of the present invention.

FIGS. 2-10 depict cross-sectional views of a portions of an IC wafer after fabrication operations in accordance with aspects of the invention. Although the cross-sectional diagrams depicted in FIGS. 2-10 are two-dimensional, it is understood that the diagrams depicted in FIGS. 2-10 represent three-dimensional structures. To assist with visualizing the three-dimensional features, a top-down reference diagram is shown in FIG. 2 to provide a reference point for the cross-sectional views (X-view, Y-view) shown in FIGS. 2-10. The X-view is an end view of the gate taken through the length of the fin, and the Y-view is an end view of the fin taken through the length of the gate.

FIG. 2 depicts a cross-sectional X-view of a portion of an IC on which an initial structure of a semiconductor device 201 is formed. The semiconductor device 201 includes individual transistors connected in series. One complete middle transistor is shown and includes the middle channel 211; a leftmost instance of the S/D regions 220; a rightmost instance of the S/D regions 220; and middle instance of the gate metal 250. The complete middle transistor is coupled in series with a rightmost transistor and a leftmost transistor. The rightmost and leftmost transistors are partially shown. The leftmost transistor includes the leftmost instance of the channel 212; the leftmost instance of the S/D region 220; another S/D region (not shown) positioned to the left of the leftmost instance of the channel 212; and the leftmost instance of the gate metal 250. The rightmost transistor includes the rightmost instance of the channel 212; the rightmost instance of the S/D region 220; another S/D region (not shown) positioned to the right of the rightmost instance of the channel 212; and the rightmost instance of the gate metal 250.

In general, the semiconductor device 201 includes a substrate 210 that includes a first (or middle) channel 211 and second (leftmost and rightmost) channels 212. The semiconductor device 201 further includes doped S/D regions 220, a capping layer 225, ILD 230, spacers 240 and gate metal 250. The doped S/D regions 220 can be formed by epitaxially growing doped S/D regions 220 on fin elements and are respectively interleaved between the first channel 211 and corresponding ones of the second channels 212. The S/D regions 220 can be doped with p-type or n-type dopants using a variety of suitable doping processes. Where the S/D regions 220 are epitaxially grown, doping can be accomplished through an in-situ doping process that is part of the epitaxial growth process. The S/D regions 220 can be epitaxially grown such that they form raised S/D regions 220 that each include positive profile surfaces 221 and negative profile surfaces 222 (see FIG. 4). The capping layer 225 is provided as a thin layer on the positive and negative profile surfaces 221 and 222 of the S/D epitaxial regions 220. The ILD 230 can also include silicon dioxide and is provided over the capping layer 225. The spacers 240 are formed on respective sides of the S/D epitaxial regions 220, the capping layer 225 and the ILD 230 and on the first channel 211 and the second channels 212. The gate metal 250 can include or be provided as high-k metal gate material and is disposed between the spacers 240 on the first channel 211 and the second channels 212. The semiconductor device 201 further includes a sacrificial layer 260, which can be formed of silicon nitride, and an optional additional silicon dioxide ILD layer 270. The sacrificial layer 260 can have a thickness that permits relatively easy removal and is deposited over uppermost surfaces of the ILD 230, the spacers 240 and the gate metal 250. The optional additional ILD layer 270 can be deposited onto the sacrificial layer 260.

In accordance with one or more embodiments of the present invention, the sacrificial layer 260 can have a thickness of about 3 nm to about 15 nm. In accordance with one or more further embodiments of the present invention, the sacrificial layer 260 can have a thickness of about 10 nm. The optional additional ILD layer 270 can have a thickness of about 20 nm to about 30 nm.

FIG. 3 depicts a cross-sectional X-view of a semiconductor device 301, which is the semiconductor device 201 after additional fabrication operations. FIG. 4 depicts a cross-sectional Y-view of the semiconductor device 301. The semiconductor device 301 is formed as a result of a patterning and a subsequent formation of a contact opening 310. The contact opening 310 is small enough to avoid overlay margin error and can have a width of about 10 nm or less or, in some cases, about 5 nm. The contact opening 310 can be open by a non-selective etch process that does not rely on polymerizing and extends through the optional additional ILD layer 270, the sacrificial layer 260, the ILD 230, the capping layer 225 and into the S/D epitaxial regions 220. The opening of the contact opening 310 also opens up or forms a recess 320 in an upper portion of each of the S/D epitaxial regions 220. This recess 320 has an initial width W and an initial depth D from an uppermost surface 2201 of the corresponding S/D epitaxial region 220. The initial width W and the initial depth D can each be increased during later isotropic etch processing.

In the semiconductor device 301, the respective portions of the optional additional ILD layer 270, the sacrificial layer 260, the ILD 230 and the capping layer 225 that remain following the opening of the contact opening 310 can be referred to as respective remainders of the optional additional ILD layer 270, the sacrificial layer 260, the ILD 230 and the capping layer 225. The respective remainders surround the contact opening 310.

FIG. 5 depicts a cross-sectional X-view of a semiconductor device 501, which is the semiconductor device 301 after additional fabrication operations. FIG. 6 depicts a cross-sectional Y-view of the secondary semiconductor device 501. The semiconductor device 501 results from a stripping of the optional additional ILD layer 270 and a subsequent isotropic etch. This isotropic etch removes the remainder of the ILD 230 from beneath overhanging portions 510 of the remainder of the sacrificial layer 260. The isotropic etch also serves to enlarge the width W and the depth D of the recess 320 (see FIG. 3) in the upper portion of each of the S/D epitaxial regions 220.

The presence of the remainder of the sacrificial layer 260 prevents a vertical erosion of the ILD layer 230 during the isotropic etch. This leads toward little to no gate height losses. The presence of the remainder of the sacrificial layer 260 also allows for relatively tight tip-to-tip (t2t) scaling without risk of t2t short circuiting.

Figure 8:
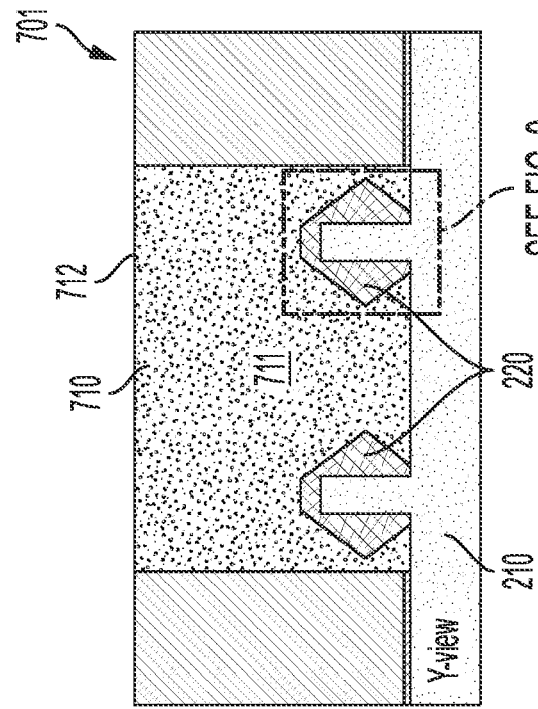
FIG. 8 is a schematic diagram illustrating a cross-sectional view of the late-stage structure of FIG. 7 taken from the Y-view of FIG. 1 after fabrication operations have been performed in accordance with one or more embodiments of the present invention.
Figure 7:
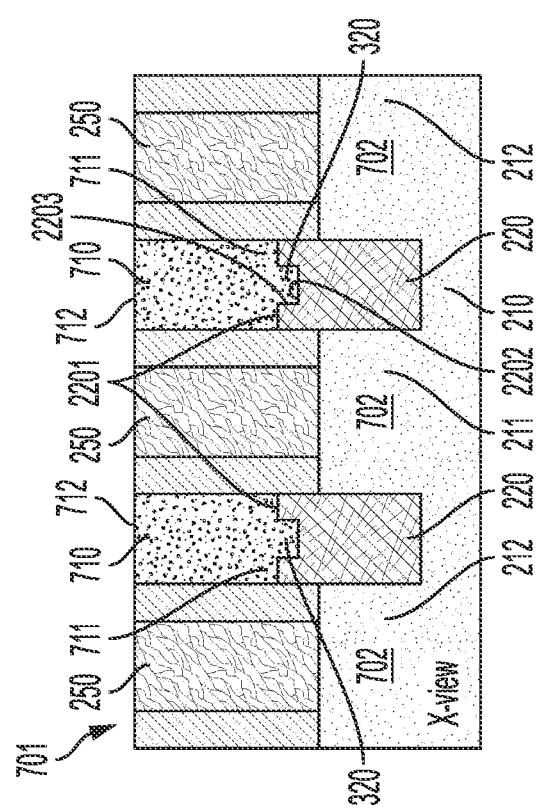
FIG. 7 is a schematic diagram illustrating a cross-sectional view of a late-stage structure of a FinFET semiconductor device taken from the X-view of FIG. 1 after fabrication operations have been performed in accordance with one or more embodiments of the present invention.
Figure 9:
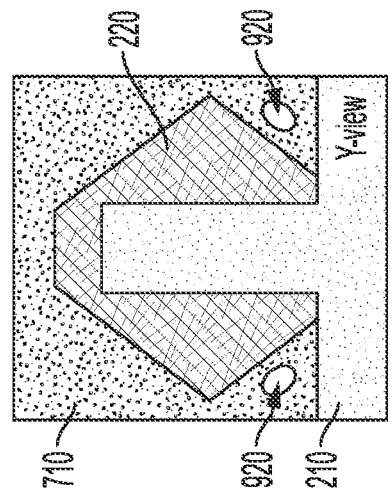
FIG. 9 is an enlarged schematic diagram illustrating a cross-sectional view of the portion of FIG. 8 which is within the dashed line taken from the Y-view of FIG. 1 after fabrication operations have been performed in accordance with one or more embodiments of the present invention.

FIG. 7 depicts a cross-sectional X-view of a semiconductor device 701, which is the semiconductor device 501 after additional fabrication operations. FIG. 8 depicts a cross-sectional Y-view of the semiconductor device 701, and FIG. 9 depicts an enlarged view of a portion of the semiconductor device 701 shown in FIG. 8. The semiconductor device 701 results a removal of the remainder of the sacrificial layer 260 and a removal of the remainder of the capping layer 225, a subsequent execution of S/D metallization and a planarizing of the S/D metallization with the gate metal 250. The execution of the S/D metallization forms S/D WACs 710 at each of the doped S/D regions 220.

As shown in FIG. 7, each of the doped S/D regions 220 includes the uppermost surface 2201, a second surface 2202 that is recessed from the uppermost surface 2201 and sidewalls 2203 that extend from the uppermost surface 2201 to the second surface 2202. The recess 320 for each doped S/D region 220 is thus defined by the second surface 2202 being recessed from the uppermost surface 2201 and the sidewalls 2203.

Each of the S/D WACs 710 is not self-aligned owing to there being an absence of a dielectric capping layer on the gate metal 250. In addition, the S/D WACs 710 each include a first portion 711 that extends into the recess 320 of the corresponding one of the doped S/D regions 220 to contact the second surface 2202 and the sidewalls 2203 and is wrapped around the corresponding one of the doped S/D regions 220 at an exterior of the recess 320. Each of the S/D WACs 710 also includes an uppermost edge 712. The lack of a dielectric capping layer on the gate metal 250 and the planarizing of the S/D metallization with the gate metal 250 results in the uppermost edge 712 being coplanar with an uppermost edge of the gate metal 250. The uppermost edge of the gate metal 250 is also coplanar with uppermost edges of the spacers 240 (see FIG. 2), with the uppermost edges of the gate metal 250 and the uppermost edges of the spacers 240 thus defining an upper extent or height of gate structures in the semiconductor device 701.

As shown in FIG. 9, the execution of the S/D metallization at each of the S/D epitaxial regions 220 results in each of the S/D WACs 710 contacting respective entireties of the negative profile surfaces 222 of the corresponding ones of the S/D epitaxial regions 220 and can lead to voids 920 being formed underneath the negative profile surfaces 222 of the S/D epitaxial regions 220.

Figure 10:
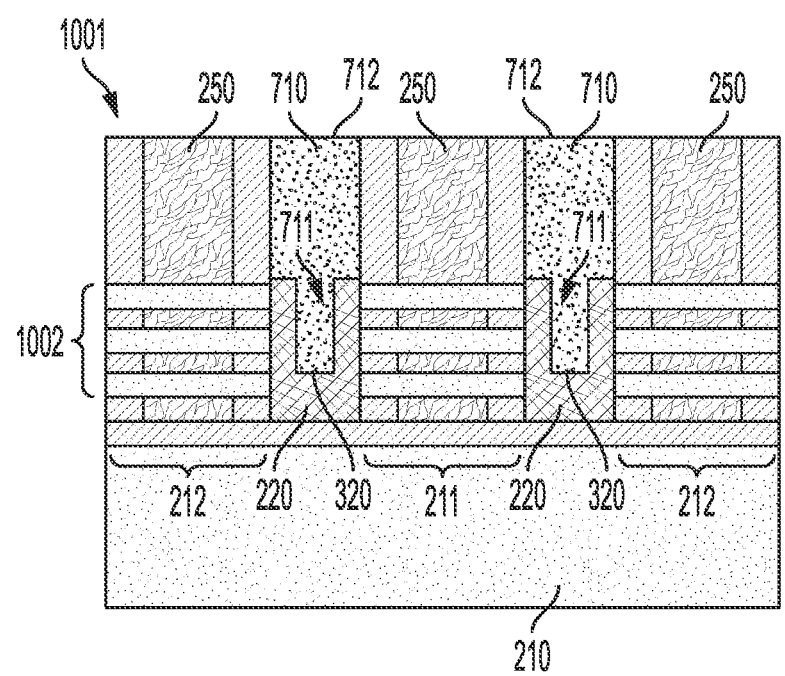
FIG. 10 is a schematic diagram illustrating a cross-sectional view of a late-stage structure of a nanosheet FET semiconductor device taken from the X-view of FIG. 1 after fabrication operations have been performed in accordance with one or more embodiments of the present invention.

FIG. 10 is a cross-sectional X-view of a semiconductor device 1001. The semiconductor device 1001 is a nanosheet implementation of the fin-based semiconductor device 701. The semiconductor device 1001 is substantially the same as the semiconductor device 701 except the channels 211, 212 in the semiconductor device 1001 are each implemented as a stack of spaced-apart nanosheets 1002; the gates 250 each wrap around the full perimeter of an associated nanosheet 1002; and the doped S/D regions 220 are formed by epitaxially grown from end regions of the nanosheets 1002. All other aspects of the fabrication operations depicted in FIGS. 1 and 2-9 can be used to fabricate the semiconductor device 1001.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit (IC) comprising:
   a substrate comprising first and second channels;
   a shared source or drain (S/D) region between the first and second channels, the shared source or drain region comprising an uppermost surface and further comprising a second surface recessed from the uppermost surface and sidewalls extending from the uppermost surface to the second surface to define a recess;
   first and second gate structures comprising gate metal disposed on the first and second channels; and
   an S/D wrap-around contact (WAC), which comprises a first portion which extends into the recess to contact the second surface and the sidewalls and which is wrapped around the S/D region at an exterior of the recess,
   wherein the S/D region comprises epitaxy having a negatively profiled section, the S/D WAC forms an elongate void under the negatively profiled section of the epitaxy of the S/D region and the negatively profiled section and the longest dimension of the elongate void are correspondingly angled relative to the substrate.

2. The semiconductor device according to claim 1, wherein:
   the S/D WAC is not self-aligned owing to an absence of a dielectric capping layer on the gate metal, and
   the S/D WAC further comprises an uppermost edge coplanar with an uppermost edge of the gate metal.

3. The semiconductor device according to claim 1, wherein:
   the epitaxy of the S/D region has a first negatively profiled section at a first side thereof and a second negatively profiled section at a second side thereof,
   the first negatively profiled section and the second negatively profiled section are oppositely angled relative to one another, and the S/D WAC contacts a respective entirety of each of the first and second negatively profiled sections of epitaxy of the S/D region.

4. The semiconductor device according to claim 3, wherein:
the S/D WAC forms a first elongate void under the first negatively profiled section of the epitaxy of the S/D region,
the S/D WAC forms a second elongate void under the second negatively profiled sections of the epitaxy of the S/D region,
the first negatively profiled section and the first elongate void are correspondingly angled relative to the substrate,
the second negatively profiled section and the second elongate void are correspondingly angled relative to the substrate, and
the first elongate void and the second elongate void are oppositely angled relative to one another.

5. The semiconductor device according to claim 1, wherein the first and second channels are each fin-shaped.

6. The semiconductor device according to claim 1, wherein the first and second channels are each a stack of spaced-apart nanosheets.

7. A method of forming a portion of an IC, according to the IC of claim 1, the method comprising:
forming a sacrificial layer;
forming a pattern configured to define a part of a contact opening having an overlay error margin;
applying a non-selective etch through the pattern without an etch stop to open the contact opening through the sacrificial layer and a dielectric to form the contact opening and the recess in the shared region; and
applying an isotropic etch through the pattern to enlarge a width and a depth of the recess.

8. The method according to claim 7, further comprising forming a FinFET or a nanosheet FET.

9. The method according to claim 7, wherein the sacrificial layer comprises silicon nitride and the dielectric comprises silicon dioxide.

10. The method according to claim 7, wherein the sacrificial layer comprises a thickness of about 3 nm to about 15 nm.

11. The method according to claim 7, wherein the contact opening comprises a width of less than about 10 nm.

12. The method according to claim 7, wherein the sacrificial layer prevents vertical erosion of the dielectric during the isotropic etch.

13. The method according to claim 7, further comprising forming a S/D contact by depositing a conductive material in the opening and the recess.

14. A method of forming a portion of an IC, according to the IC of claim 1, the method comprising:
forming a sacrificial layer;
forming a pattern configured to define a part of a contact opening having an initial width;
using the pattern and a removal process to form the contact opening through the sacrificial layer, through the dielectric, and into the recess of the shared region;
forming an increased width of the contact opening, an increased width of the recess, and an increased depth of the recess by removing an additional region of the dielectric and an additional region of the recess;
removing the sacrificial layer; and
removing a capping layer from the shared S/D region.

15. The method according to claim 14, further comprising forming a FinFET or a nanosheet FET.

16. The method according to claim 14, wherein the sacrificial layer comprises silicon nitride and the dielectric comprises silicon dioxide.

17. The method according to claim 14, wherein the sacrificial layer comprises a thickness of about 3 nm to about 15 nm.

18. The method according to claim 14, wherein the increased width of the contact opening comprises a width of less than about 10 nm.

19. The method according to claim 14, wherein:
removing the additional region of the dielectric and the additional region of the recess comprises applying isotropic etching; and
the sacrificial layer prevents vertical erosion of the dielectric during the isotropic etching.

20. The method according to claim 14, further comprising forming a wrap-around S/D contact by depositing a conductive material in the opening and the recess.

* * * * *